(12) United States Patent
Lin et al.

(10) Patent No.: US 8,158,508 B2
(45) Date of Patent: Apr. 17, 2012

(54) STRUCTURE AND MANUFACTURING METHOD OF A CHIP SCALE PACKAGE

(75) Inventors: Mou-Shiung Lin, Hsin-Chu (TW);
Ming-Ta Lei, Hsin-Chu (TW);
Chuen-Jye Lin, Taichung (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 11/981,125

(22) Filed: Oct. 31, 2007

(65) Prior Publication Data

US 2008/0088019 A1   Apr. 17, 2008

Related U.S. Application Data

(63) Continuation of application No. 09/837,007, filed on Apr. 18, 2001, now abandoned, which is a continuation-in-part of application No. 09/798,654, filed on Mar. 5, 2001, now Pat. No. 6,818,545.

(51) Int. Cl.
*H01L 21/44* (2006.01)

(52) U.S. Cl. ......... 438/614; 438/611; 438/737; 438/739

(58) Field of Classification Search ............ 438/614, 438/611, 737, 739
See application file for complete search history.

(56) References Cited

U.S. PATENT DOCUMENTS

| | | |
|---|---|---|
| 4,087,314 A | 5/1978 | George |
| 4,179,802 A | 12/1979 | Joshi et al. |
| 4,652,336 A | 3/1987 | Andrascek |
| 4,685,998 A | 8/1987 | Quinn et al. |
| 5,046,161 A | 9/1991 | Takada |
| 5,061,985 A | 10/1991 | Meguro et al. |
| 5,071,518 A | 12/1991 | Pan |
| 5,083,187 A | 1/1992 | Lamson |
| 5,108,950 A | 4/1992 | Wakabayashi et al. |
| 5,132,775 A | 7/1992 | Brighton et al. |
| 5,172,471 A | 12/1992 | Huang |
| 5,226,232 A | 7/1993 | Boyd |
| 5,244,833 A | 9/1993 | Gansauge et al. |
| 5,251,806 A | 10/1993 | Agarwala et al. |
| 5,252,781 A | 10/1993 | Shirai |

(Continued)

FOREIGN PATENT DOCUMENTS

EP   1005082   5/2000

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — David Zarneke
(74) *Attorney, Agent, or Firm* — McDermott Will & Emery LLP

(57) ABSTRACT

A new method and package is provided for the mounting of semiconductor devices that have been provided with small-pitch Input/Output interconnect bumps. Fine pitch solder bumps, consisting of pillar metal and a solder bump, are applied directly to the I/O pads of the semiconductor device, the device is then flip-chip bonded to a substrate. Dummy bumps may be provided for cases where the I/O pads of the device are arranged such that additional mechanical support for the device is required.

36 Claims, 14 Drawing Sheets

U.S. PATENT DOCUMENTS

| | | |
|---|---|---|
| 5,261,155 A | 11/1993 | Angulas et al. |
| 5,349,495 A | 9/1994 | Visel et al. |
| 5,418,186 A | 5/1995 | Park et al. |
| 5,439,162 A * | 8/1995 | George et al. ............ 228/180.22 |
| 5,468,984 A | 11/1995 | Efland et al. |
| 5,508,561 A | 4/1996 | Tago et al. |
| 5,523,920 A | 6/1996 | Machuga |
| 5,532,512 A | 7/1996 | Fillion et al. |
| 5,541,135 A | 7/1996 | Pfeifer |
| 5,554,940 A | 9/1996 | Hubacher |
| 5,565,379 A | 10/1996 | Baba |
| 5,567,655 A | 10/1996 | Rostoker et al. |
| 5,600,180 A | 2/1997 | Kusaka et al. |
| 5,633,535 A | 5/1997 | Chao et al. |
| 5,643,830 A | 7/1997 | Rostoker et al. |
| 5,656,858 A | 8/1997 | Kondo et al. |
| 5,656,863 A | 8/1997 | Yasunaga |
| 5,659,201 A | 8/1997 | Wollesen |
| 5,664,642 A | 9/1997 | Williams |
| 5,665,639 A | 9/1997 | Seppala et al. |
| 5,691,248 A | 11/1997 | Cronin et al. |
| 5,731,223 A | 3/1998 | Padmanabhan |
| 5,741,726 A | 4/1998 | Barber |
| 5,744,843 A | 4/1998 | Efland et al. |
| 5,756,370 A | 5/1998 | Farnworth et al. |
| 5,767,010 A | 6/1998 | Mis et al. |
| 5,790,377 A | 8/1998 | Schreiber et al. |
| 5,792,594 A | 8/1998 | Brown et al. |
| 5,796,169 A | 8/1998 | Dockerty et al. |
| 5,834,844 A | 11/1998 | Akagawa et al. |
| 5,834,849 A | 11/1998 | Lane |
| 5,844,782 A | 12/1998 | Fukasawa |
| 5,854,513 A | 12/1998 | Kim |
| 5,870,822 A | 2/1999 | Drake et al. |
| 5,872,399 A | 2/1999 | Lee |
| 5,882,957 A | 3/1999 | Lin |
| 5,883,435 A | 3/1999 | Geffken et al. |
| 5,892,273 A | 4/1999 | Iwasaki |
| 5,898,222 A | 4/1999 | Farooq et al. |
| 5,931,371 A | 8/1999 | Pao et al. |
| 5,943,597 A | 8/1999 | Kleffner |
| 6,013,571 A | 1/2000 | Morrell |
| 6,015,505 A | 1/2000 | David et al. |
| 6,022,792 A | 2/2000 | Ishii et al. |
| 6,030,512 A | 2/2000 | Ihara et al. |
| 6,042,953 A | 3/2000 | Yamaguchi |
| 6,049,122 A | 4/2000 | Yoneda |
| 6,051,450 A | 4/2000 | Ohsawa et al. |
| 6,060,683 A | 5/2000 | Estrada |
| 6,072,236 A | 6/2000 | Akram |
| 6,075,290 A | 6/2000 | Schaefer et al. |
| 6,077,726 A | 6/2000 | Mistry et al. |
| 6,093,964 A | 7/2000 | Saitoh |
| 6,103,552 A | 8/2000 | Lin |
| 6,124,634 A | 9/2000 | Akram |
| 6,144,100 A | 11/2000 | Shen |
| 6,160,715 A | 12/2000 | Degani et al. |
| 6,162,652 A | 12/2000 | Dass et al. |
| 6,169,329 B1 | 1/2001 | Farnworth et al. |
| 6,180,265 B1 | 1/2001 | Erickson |
| 6,184,143 B1 | 2/2001 | Ohashi et al. |
| 6,187,680 B1 | 2/2001 | Costrini et al. |
| 6,191,493 B1 | 2/2001 | Yasunaga et al. |
| 6,198,169 B1 | 3/2001 | Kobayashi |
| 6,198,619 B1 | 3/2001 | Fujioka |
| 6,201,305 B1 | 3/2001 | Darveaux |
| 6,250,541 B1 | 6/2001 | Shangguan |
| 6,329,605 B1 | 12/2001 | Beroz |
| 6,329,721 B1 | 12/2001 | DiGiacomo |
| 6,359,328 B1 | 3/2002 | Dubin |
| 6,362,087 B1 | 3/2002 | Wang et al. |
| 6,372,622 B1 | 4/2002 | Tan |
| 6,380,061 B1 | 4/2002 | Kobayashi |
| 6,396,155 B1 | 5/2002 | Nukiwa et al. |
| 6,396,707 B1 | 5/2002 | Huang |
| 6,429,120 B1 | 8/2002 | Ahn et al. |
| 6,429,531 B1 | 8/2002 | Mistry |
| 6,441,316 B1 | 8/2002 | Kusui |
| 6,448,504 B1 | 9/2002 | Taguchi |
| 6,452,270 B1 | 9/2002 | Huang |
| 6,467,674 B1 | 10/2002 | Mihara |
| 6,472,745 B1 | 10/2002 | Iizuka |
| 6,495,397 B2 | 12/2002 | Kubota et al. |
| 6,501,169 B1 | 12/2002 | Aoki |
| 6,518,092 B2 | 2/2003 | Kikuchi |
| 6,552,436 B2 | 4/2003 | Burnette |
| 6,573,598 B2 | 6/2003 | Ohuchi |
| 6,578,754 B1 | 6/2003 | Tung |
| 6,592,019 B2 | 7/2003 | Tung |
| 6,600,234 B2 | 7/2003 | Kuwabara |
| 6,614,091 B1 | 9/2003 | Downey et al. |
| 6,627,988 B2 | 9/2003 | Andoh |
| 6,639,299 B2 | 10/2003 | Aoki |
| 6,646,347 B2 | 11/2003 | Mercado et al. |
| 6,653,563 B2 | 11/2003 | Bohr |
| 6,661,100 B1 | 12/2003 | Anderson et al. |
| 6,683,380 B2 | 1/2004 | Efland et al. |
| 6,707,124 B2 | 3/2004 | Wachtler et al. |
| 6,731,003 B2 | 5/2004 | Joshi |
| 6,732,913 B2 | 5/2004 | Alvarez |
| 6,780,748 B2 | 8/2004 | Yamaguchi et al. |
| 6,809,020 B2 | 10/2004 | Sakurai |
| 6,815,324 B2 | 11/2004 | Huang et al. |
| 6,818,545 B2 | 11/2004 | Lee et al. |
| 6,861,742 B2 | 3/2005 | Miyamoto |
| 6,864,165 B1 | 3/2005 | Pogge et al. |
| 6,917,106 B2 | 7/2005 | Datta |
| 6,940,169 B2 | 9/2005 | Jin |
| 6,943,440 B2 | 9/2005 | Kim et al. |
| 6,963,136 B2 | 11/2005 | Shinozaki |
| 6,977,435 B2 | 12/2005 | Kim |
| 6,998,710 B2 | 2/2006 | Kobayashi |
| 7,008,867 B2 | 3/2006 | Lei |
| 7,064,435 B2 | 6/2006 | Chung |
| 7,098,127 B2 | 8/2006 | Ito |
| 7,135,766 B1 | 11/2006 | Costa |
| 7,196,001 B2 | 3/2007 | Datta |
| 7,208,834 B2 * | 4/2007 | Lee et al. ...................... 257/737 |
| 7,239,028 B2 | 7/2007 | Anzai |
| 7,246,432 B2 | 7/2007 | Tanaka et al. |
| 7,335,536 B2 | 2/2008 | Lange |
| 7,355,288 B2 * | 4/2008 | Lee et al. ...................... 257/780 |
| 7,456,089 B2 | 11/2008 | Aiba |
| 7,462,942 B2 | 12/2008 | Tan |
| 7,479,690 B2 | 1/2009 | Shiraishi |
| 2001/0008224 A1 | 7/2001 | Woolsey |
| 2001/0051426 A1 | 12/2001 | Pozder et al. |
| 2002/0158334 A1 | 10/2002 | Vu et al. |
| 2003/0218246 A1 | 11/2003 | Abe et al. |
| 2004/0023450 A1 | 2/2004 | Katagiri et al. |

FOREIGN PATENT DOCUMENTS

| | | |
|---|---|---|
| JP | 60217646 | 10/1985 |
| JP | 1061038 | 3/1989 |
| JP | 4278543 | 10/1992 |
| JP | 4318935 | 11/1992 |
| JP | 05-335313 | 12/1993 |
| JP | 06333931 | 12/1994 |
| JP | 1961221 | 8/1995 |
| JP | 1985660 | 10/1995 |
| JP | 8013166 | 1/1996 |
| JP | 2785338 | 8/1998 |
| JP | 10-275811 | 10/1998 |
| JP | 11-163019 | 6/1999 |
| JP | 11354578 | 12/1999 |
| JP | 2000106362 | 4/2000 |
| JP | 2000192216 | 7/2000 |
| JP | 2000 228420 | 8/2000 |
| JP | 2002228420 | 8/2000 |
| JP | 2000 260803 | 9/2000 |
| JP | 2000260803 | 9/2000 |
| JP | 2002016096 | 1/2002 |
| JP | 2004335255 | 11/2004 |
| JP | 2005284490 | 10/2005 |
| JP | 2006128662 | 5/2006 |
| JP | 2006147810 | 6/2006 |
| JP | 3829325 | 10/2006 |

| | | |
|---|---|---|
| JP | 3850261 | 11/2006 |
| JP | 3856304 | 12/2006 |
| TW | 417265 | 1/2001 |
| TW | 432653 | 5/2001 |
| TW | 444364 | 7/2001 |
| TW | 445618 | 7/2001 |
| TW | 452950 | 9/2001 |
| WO | WO 01/82375 | 11/2001 |
| WO | WO 0182375 | 11/2001 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Devide," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

U.S. Appl. No. 09/837,007, filed Apr. 18, 2001, Zarneke, David A., Abandoned.

U.S. Appl. No. 11/389,717, filed Mar. 27, 2006, Zarneke, David A., Abandoned.

U.S. Appl. No. 11/981,125, filed Oct. 31, 2007, Zarneke, David A., Non-Final OA mailed Jun. 3, 2011.

U.S. Appl. No. 11/981,138, filed Oct. 31, 2007, Zarneke, David A., Issued as Patent No. 7902679.

U.S. Appl. No. 12/384,977, filed Apr. 9, 2009, Zarneke, David A., Non-Final OA mailed Apr. 15, 2011.

U.S. Appl. No. 12/852,467, filed Aug. 7, 2010, Zarneke, David A., Abandoned.

U.S. Appl. No. 12/852,470, filed Aug. 7, 2010, Zarneke, David A., Abandoned.

* cited by examiner

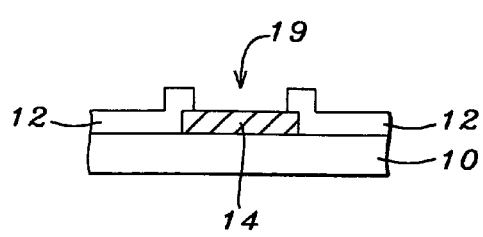
FIG. 1 - Prior Art
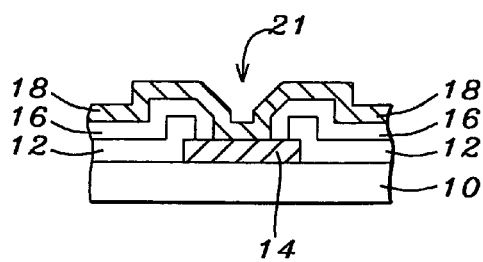
FIG. 2 - Prior Art
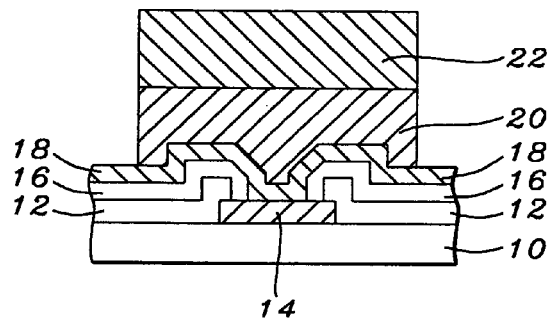
FIG. 3 - Prior Art
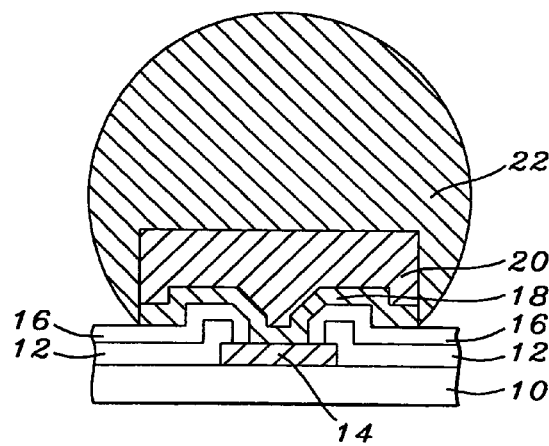
FIG. 4 - Prior Art

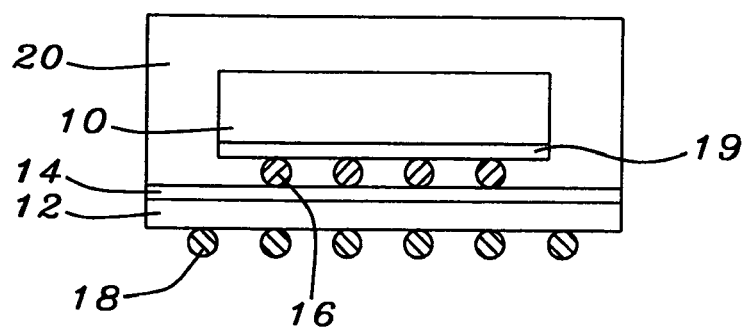
FIG. 5 - Prior Art
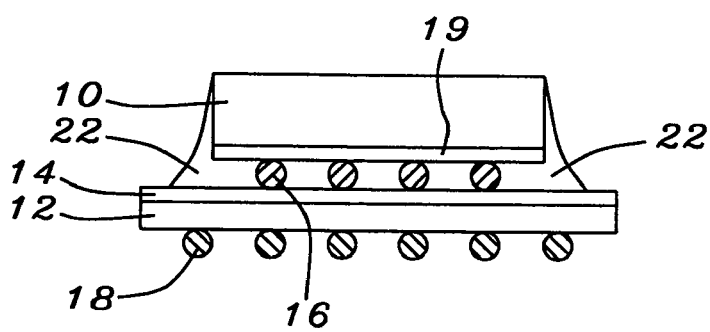
FIG. 6 - Prior Art

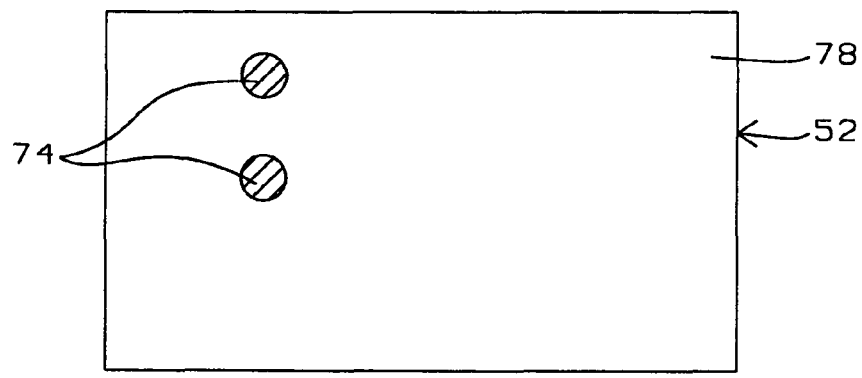
FIG. 25 — Prior Art
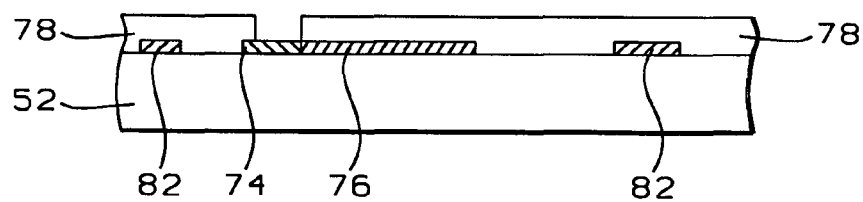
FIG. 26 — Prior Art

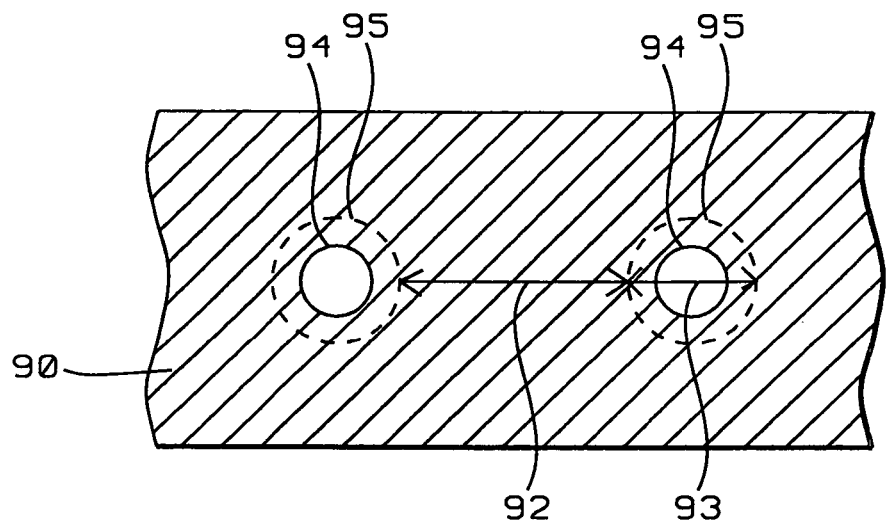
FIG. 28a - Prior Art
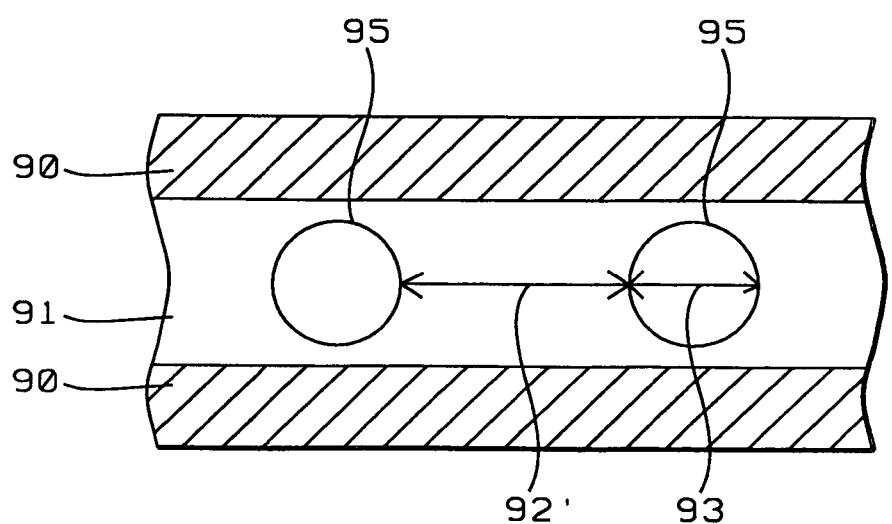
FIG. 28b

STRUCTURE AND MANUFACTURING METHOD OF A CHIP SCALE PACKAGE

RELATED PATENT APPLICATION

This application is a Continuation application of Ser. No. 09/837,007, filed on Apr. 18, 2001, now abandoned, which is a Continuation-in-part of Ser. No. 09/798,654, filed on Mar. 5, 2001, now U.S. Pat. No. 6,818,545.

BACKGROUND OF THE INVENTION (1) Field of the Invention

The invention relates to the fabrication of integrated circuit devices, and more particularly, to a method and package for packaging semiconductor devices.

(2) Description of the Prior Art

Semiconductor device performance improvements are largely achieved by reducing device dimensions, a development that has at the same time resulted in considerable increases in device density and device complexity. These developments have resulted in placing increasing demands on the methods and techniques that are used to access the devices, also referred to as Input/Output (I/O) capabilities of the device. This has led to new methods of packaging semiconductor devices whereby structures such as Ball Grid Array (BGA) devices and Column Grid Array (CGA) devices have been developed. A Ball Grid Array (BGA) is an array of solder balls placed on a chip carrier. The balls contact a printed circuit board in an array configuration where, after reheat, the balls connect the chip to the printed circuit board. BGA's are known with 40, 50 and 60 mil spacings. Due to the increased device miniaturization, the impact that device interconnects have on device performance and device cost has also become a larger factor in package development. Device interconnects, due to their increase in length in order to package complex devices and connect these devices to surrounding circuitry, tend to have an increasingly negative impact on the package performance. For longer and more robust metal interconnects, the parasitic capacitance and resistance of the metal interconnection increase, which degrades the chip performance significantly. Of particular concern in this respect is the voltage drop along power and ground buses and the RC delay that is introduced in the critical signal paths.

One of the approaches that has been taken to solve these packaging problems is to develop low resistance metals (such as copper) for the interconnect wires, while low dielectric constant materials are being used in between signal lines. Another approach to solve problems of I/O capability has been to design chips and chip packaging techniques that offer dependable methods of increased interconnecting of chips at a reasonable manufacturing cost.

One of the more recent developments that is aimed at increasing the Input-Output (I/O) capabilities of semiconductor device packages is the development of Flip Chip Packages. Flip-chip technology fabricates bumps (typically Pb/Sn solders) on aluminum pads on a semiconductor device. The bumps are interconnected directly to the package media, which are usually ceramic or plastic based. The flip-chip is bonded face down to the package medium through the shortest paths. These technologies can be applied not only to single-chip packaging, but also to higher or integrated levels of packaging in which the packages are larger, and to more sophisticated substrates that accommodate several chips to form larger functional units.

In general, Chip-On-Board (COB) techniques are used to attach semiconductor die to a printed circuit board; these techniques include the technical disciplines of flip chip attachment, wirebonding, and tape automated bonding (TAB). Flip chip attachment consists of attaching a flip chip to a printed circuit board or to another substrate. A flip chip is a semiconductor chip that has a pattern or arrays of terminals that are spaced around an active surface area of the flip chip, allowing for face down mounting of the flip chip to a substrate.

Generally, the flip chip active surface has one of the following electrical connectors: BGA (wherein an array of minute solder balls is created on the surface of the flip chip that attaches to the substrate); Slightly Larger than Integrated Circuit Carrier (SLICC) (which is similar to the BGA but has a smaller solder ball pitch and diameter than the BGA); a Pin Grid Array (PGA) (wherein an array of small pins extends substantially perpendicularly from the attachment surface of a flip chip, such that the pins conform to a specific arrangement on a printed circuit board or other substrate for attachment thereto). With the BGA or SLICC, the solder or other conductive ball arrangement on the flip chip must be a mirror image of the connecting bond pads on the printed circuit board so that precise connection can be made.

In creating semiconductor devices, the technology of interconnecting devices and device features is a continuing challenge in the era of sub-micron devices. Bond pads and solder bumps are frequently used for this purpose, whereby continuous effort is dedicated to creating bond pads and solder bumps that are simple, reliable and inexpensive.

Bond pads are generally used to wire device elements and to provide exposed contact regions of the die. These contact regions are suitable for wiring the die to components that are external to the die. An example is where a bond wire is attached to a bond pad of a semiconductor die at one end and to a portion of a Printed Circuit Board at the other end of the wire. The art is constantly striving to achieve improvements in the creation of bond pads that simplify the manufacturing process while enhancing bond pad reliability.

Materials that are typically used for bond pads include metallic materials, such as tungsten and aluminum, while heavily doped polysilicon can also be used for contacting material. The bond pad is formed on the top surface of the semiconductor device whereby the electrically conducting material is frequently embedded in an insulating layer of dielectric. In using polysilicon as the bond pad material, polysilicon can be doped with an n-type dopant for contacting N-regions while it can be doped with p-type dopant for contacting P-regions. This approach of doping avoids inter-diffusion of the dopants and dopant migration. It is clear that low contact resistance for the bond pad area is required while concerns of avoidance of moisture or chemical solvent absorption, thin film adhesion characteristics, delamination and cracking play an important part in the creation of bond pads.

The conventional processing sequence that is used to create an aluminum bond pad starts with a semiconductor surface, typically the surface of a silicon single crystalline substrate. A layer of Intra Metal Dielectric (IMD) is deposited over the surface, a layer of metal, typically aluminum, is deposited over the surface of the layer of IMD. The layer of metal is patterned and etched typically using a layer of photoresist and conventional methods of photolithography and etching. After a bond pad has been created in this manner, a layer of passivation is deposited over the layer of IMD. An opening that aligns with the bond pad is created in the layer of passivation, again using methods of photolithography and etching.

A conventional method that is used to create a solder bump over a contact pad is next highlighted. FIGS. 1 through 4 show an example of one of the methods that is used to create an interconnect bump. A semiconductor surface 10 has been provided with a metal contact pad 14; the semiconductor surface 10 is protected with a layer 12 of passivation. An opening 19 has been created in the layer 12 of passivation; the surface of the metal contact pad 14 is exposed through this opening 19. Next, in FIG. 2, a dielectric layer 16 is deposited over the surface of the layer 12 of passivation. The layer 16 of dielectric is patterned and etched, creating an opening 21 in the layer 16 of dielectric that aligns with the metal pad 14 and that partially exposes the surface of the metal pad 14. A layer 18 of metal, typically using Under-Bump-Metallurgy (UBM), is created over the layer 16 of dielectric; layer 18 of metal is in contact with the surface of the metal pad 14 inside opening 21. The region of layer 18 of metal that is above the metal pad 14 will, at a later point in the processing, form a pedestal over which the interconnect bump will be formed. This pedestal can be further extended in a vertical direction by the deposition and patterning of one or more additional layers that may contain a photoresist or a dielectric material; these additional layers are not shown in FIG. 2. These layers essentially have the shape of layer 16 and are removed during one of the final processing steps that is applied for the formation of the interconnect bump.

A layer of photoresist (not shown) is deposited, patterned and etched, creating an opening that aligns with the contact pad 14. A layer 20 of metal, such as copper or nickel, shown in FIG. 3, that forms an integral part of the pedestal of the to be created interconnect bump, is next electroplated in the opening created in the layer of photoresist and on the surface of the layer 18 of metal, whereby the layer 18 serves as the lower electrode during the plating process. Layer 20 in prior art applications has a thickness of between about 1 and 10 μm with a typical value of about 5 μm. The final layer 22 of solder is electroplated on the surface of layer 20. The patterned layer of photoresist is then removed.

The layer 18 of metal is next etched, as in FIG. 4, leaving in place only the pedestal for the interconnect bump. During this etch process the deposited layers 20 and 22 serve as a mask. If, as indicated above, additional layers of dielectric or photoresist have been deposited for the further shaping of pedestal 18 in FIG. 2, these layers are also removed at this time.

A solder paste or flux (not shown) is now applied to the layer 22 of solder, and the solder 22 is melted in a reflow surface typically under a nitrogen atmosphere, creating the spherically shaped interconnect bump 22 that is shown in FIG. 4.

In addition to the above indicated additional layers of dielectric or photoresist that can be used to further shape the pedestal of the interconnect bump, many of the applications that are aimed at creating interconnect bumps make use of layers of metal that serve as barrier layers or that have other specific purposes, such as the improvement of adhesion of the various overlying layers or the prevention of diffusion of materials between adjacent layers. These layers collectively form layer 18 of FIG. 4 and have, as is clear from the above, an effect on the shape of the completed bump and are therefore frequently referred to as Ball Limiting Metal (BLM) layer. Frequently used BLM layers are successive and overlying layers of chrome, copper and gold, whereby the chrome is used to enhance adhesion with an underlying aluminum contact pad, the copper layer serves to prevent diffusion of solder materials into underlying layers, while the gold layer serves to prevent oxidation of the surface of the copper layer. The BLM layer is layer 18 of FIGS. 2 through 4.

Increased device density brings with it increased closeness of components and elements that are part of the created semiconductor devices. This increased closeness is expressed as a reduction in the spacing or "pitch" between elements of a semiconductor device. State-of-the-art technology uses solder bumps having a pitch of about 200 μm, which imposes a limitation on further increasing device density. The limitation in further reducing the pitch of solder bumps is imposed by concerns of reliability, which impose a relatively large ball size for the solder bump. This relatively large solder ball restricts further reducing the solder ball pitch.

In the majority of applications, solder bumps are used as interconnections between I/O bond pads and a substrate or printed circuit board. A large solder ball brings with it high standoff since a solder ball with high standoff has better thermal performance (CTE mismatching is easier to avoid resulting in reduced thermal stress on the solder balls). Large solder balls are therefore required in order to maintain interconnect reliability. Low-alpha solder is applied to avoid soft error (electrical or functional errors) from occurring, thereby eliminating the potential for inadvertent memory discharge and incorrect setting of the voltage (1 or 0).

U.S. Pat. No. 6,169,329 (Farnworth et al.) shows standardized die to substrate bonding locations (Ball grid or other array).

U.S. Pat. No. 5,741,726 (Barber) shows an assembly with minimized bond finger connections.

U.S. Pat. No. 5,744,843 (Efland et al.), U.S. Pat. No. 5,172,471 (Huang), U.S. Pat. No. 6,060,683 (Estrade), U.S. Pat. No. 5,643,830 (Rostoker et al.), and U.S. Pat. No. 6,160,715 (Degani et al.) are related patents.

The invention addresses concerns of creating a BGA type package whereby the pitch of the solder ball or solder bump of the device interconnect is in the range of 200 μm or less. The conventional, state-of-the-art solder process runs into limitations for such a fine interconnect pad pitch, the invention provides a method and a package for attaching devices having very small ball pitch to an interconnect medium such as a Printed Circuit Board.

SUMMARY OF THE INVENTION

A principal objective of the invention is to provide a method of creating a fine-pitch solder bump.

Another objective of the invention is to provide a method of creating smaller solder bumps, further allowing for the creation of fine-pitched solder bumps.

Another objective of the invention is to provide a cost-effective method to create a fine-pitch solder bump of high reliability, due to the increased height of the solder bump. This objective is based on the belief that solder bump reliability improves proportionally to the square of the distance between the solder ball and the underlying substrate.

Another objective of the invention is to provide a cost-effective way of creating a solder bump. This cost-effective way is realized by using standard solder material and therewith eliminating the need for expensive "low-α solder".

Another objective of the invention is to provide a cost-effective method of creating a fine-pitch solder bump by reducing the alpha-effect on memory products.

Another objective of the invention is to provide a method of creating solder bumps which allows an easy method of cleaning flux after the process of creating the solder bump has been completed.

Another objective of the invention is to provide a method of creating solder bumps which allows easy application of underfill.

Another objective of the invention is to provide a method for applying fine pitch solder bumps directly to the I/O pads of a semiconductor device, without a redistribution interface, and bonding the semiconductor device directly to a Ball Grid Array substrate using the flip-chip bonding approach.

Another objective of the invention is to provide a method for shortening the interconnection between a semiconductor device and the substrate on which the device is mounted, thus improving the electrical performance of the device.

Yet another objective of the invention is to eliminate conventional methods of re-distribution of device I/O interconnect, thereby making packaging of the device more cost-effective and eliminating performance degradation.

A still further objective of the invention is to improve chip accessibility during testing of the device, thus eliminating the need for special test fixtures.

A still further objective of the invention is to improve performance and device reliability of BGA packages that are used for the mounting of semiconductor devices having small-pitch I/O interconnect bumps.

A still further objective of the invention is to perform Chip Scale Packaging (CSP) without re-distribution, including for various pad designs such as peripheral or central pad designs.

A still further objective of the invention is to provide a method of mounting small-pitch semiconductor devices in such a manner that flux removal and the dispensing of device encapsulants is improved.

In accordance with the objectives of the invention a new method and package is provided for the mounting of semiconductor devices that have been provided with small-pitch Input/Output interconnect bumps. Fine pitch solder bumps, consisting of pillar metal and a solder bump, are applied directly to the I/O pads of the semiconductor device, the device is then flip-chip bonded to a substrate. Dummy bumps may be provided for cases where the I/O pads of the device are arranged such that additional mechanical support for the device is required.

BRIEF DESCRIPTION OF THE DRAWINGS

FIGS. 1 through 4 show a prior art method of creating a solder bump overlying a point of electrical contact, as follows:

FIG. 1 shows a cross section of a semiconductor surface on the surface of which a contact pad has been created; the semiconductor surface is covered with a patterned layer of passivation.

FIG. 2 shows the cross section of FIG. 1 after a patterned layer of dielectric and a layer of metal have been created on the semiconductor surface.

FIG. 3 shows a cross section of FIG. 2 after a layer of bump metal and solder compound have been selectively deposited.

FIG. 4 show a cross section after excessive layers have been removed from the semiconductor surface and, after the solder has been reflowed, forming the interconnect bump.

FIG. 5 shows a cross section of the BGA package of the invention; the semiconductor device is encapsulated in a molding compound.

FIG. 6 shows a cross section of the BGA package of the invention; underfill is provided to the semiconductor device.

FIG. 7 shows a cross section of a semiconductor surface, a layer of dielectric has been deposited, metal pads have been created, a layer of passivation has been deposited and patterned, and a layer of barrier material has been deposited.

FIG. 8 shows a cross section after a patterned layer of photoresist has been created over the structure of FIG. 7.

FIG. 9 shows a cross section after pillar metal has been created aligned with the metal pads and under bump metal has been deposited over the surface of the pillar metal.

FIG. 10 shows a cross section after solder metal has been plated over the under bump metal.

FIG. 11 shows a cross section after the patterned layer of photoresist has been removed from the surface.

FIG. 12 shows a cross section after the diameter of the pillar metal has been reduced.

FIG. 13 shows a cross section after the barrier layer has been etched using isotropic etching, creating a first profile.

FIG. 14 shows a cross section after the barrier layer has been etched using anisotropic etching or RIE, creating a second profile.

FIG. 15 shows a cross-section of a completed first solder bump of the present invention.

FIG. 16 shows a cross-section of a completed second solder bump of the present invention.

FIG. 25 shows a top view of a prior art substrate with exposed I/O contact pads; the solder mask is in close proximity to the contact pads of the semiconductor device.

FIG. 26 shows a cross section of the substrate of FIG. 25.

FIGS. 28*a* and 28*b* demonstrate how the invention leads to the ability to reduce the pitch between I/O pads.

DESCRIPTION OF THE PREFERRED EMBODIMENTS

Figure 7:
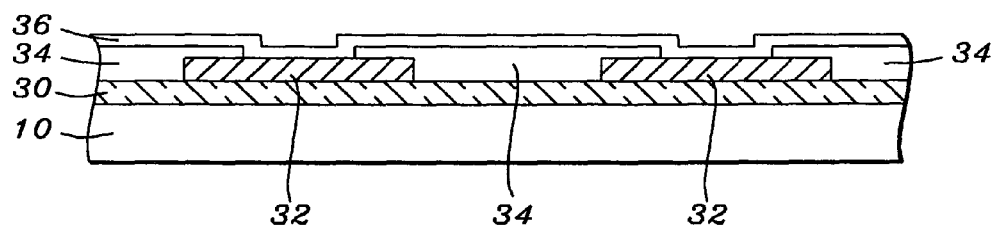
FIGS. 7 through 16 address the invention, as follows.

The above stated objective of improving chip accessibility during testing of the device, thus eliminating the need for special test fixtures, can further be highlighted as follows. The disclosed method of the invention, using Chip Scale Packaging (CSP), can control the cost of testing CSP devices by keeping the same body size of the chip and by using the same size substrate. For conventional CSP packages, the chip may have different body sizes, which imposes the requirement of different size test fixtures. With the continued reduction of the size of semiconductor devices, additional and varying device sizes are expected to be used. This would result in ever increasing costs for back-end testing of the devices in a production environment. The invention provides a method where these additional back-end testing costs can be avoided.

Referring now to FIG. 5, there is shown a cross section of a typical flip chip package with the semiconductor device being encapsulated in a molding compound. The Integrated Circuit (IC) device 10 enters the process as a separate unit with the contact points (balls 16) attached to the bottom of the chip 10. The IC 10 is placed on the surface of a BGA substrate 12, an (optional) interconnect substrate 14 has been provided for additional routing of the electrical network to which device 10 is attached. The balls 18 that are connected to the lower surface of the substrate 12 make contact with surrounding circuitry (not shown). The paths of electrical interconnect of device 10 as shown in cross section in FIG. 5 are as follows: contact bumps (points of I/O interconnect, not shown in FIG. 5) are provided on the surface of device that faces substrate 12 and contact balls 16 are connected to these contact bumps. Contact balls 16 interface with points of contact (contact pads) provided in the surface of the (optional) interconnect network 14 or, for applications where the interconnect interface 14 is not provided, with points of contact (contact pads) provided in the surface of the Ball Grid Array (BGA) substrate 12. BGA substrate 12 may further have been provided with one or more layers of interconnect metal, all of the interfaces (the interconnect substrate 12 and the optional redistribution lines provided in BGA substrate 12) result in interconnecting balls 16 with balls 18. Balls 18 are the contact points that connect the package that is shown in cross section in FIG. 5 to surrounding circuitry.

Whereas the cross section that is shown in FIG. 5 shows contact balls 16 for the establishment of contacts between device 10 and the underlying substrate 12, some prior art applications still used wire bond connections (not shown in FIG. 5), this in order to achieve optimum electrical performance of the device package.

Further shown in the cross section of FIG. 5 is layer 19, which may be provided over the surface of semiconductor device 10 facing the substrate 12. This re-distribution layer provides interconnect lines over the surface of device 10 and is required in prior art applications if solder bumps are required on current pad layout for wire bonding purposes. The main purpose of the redistribution layer is to enlarge the pitch of solder bump interconnects if the bond pads are originally designed for wire bonding applications. It will be clear from later explanations that the invention removes the need for the redistribution layer.

FIG. 6 shows a cross section of a conventional BGA package whereby the semiconductor device 10 is provided with underfill 22, no molding compound (20, FIG. 5) has been provided in the package that is shown in cross section in FIG. 6. All the other statements that relate to the electrical interconnection of the device 10 of FIG. 6 are identical to the statements that have been made in the description provided for the package of FIG. 5. It should be noted in FIG. 6 that the sides of the underfill 22 are sloping such that the physical contact between the underfill 22 and the substrate 12 is extended beyond the dimensions of the bottom surface of the chip 10. This is a normal phenomenon with liquid underfill, which enhances the mechanical strength between the substrate 12 and the IC chip 10.

Figure 15:
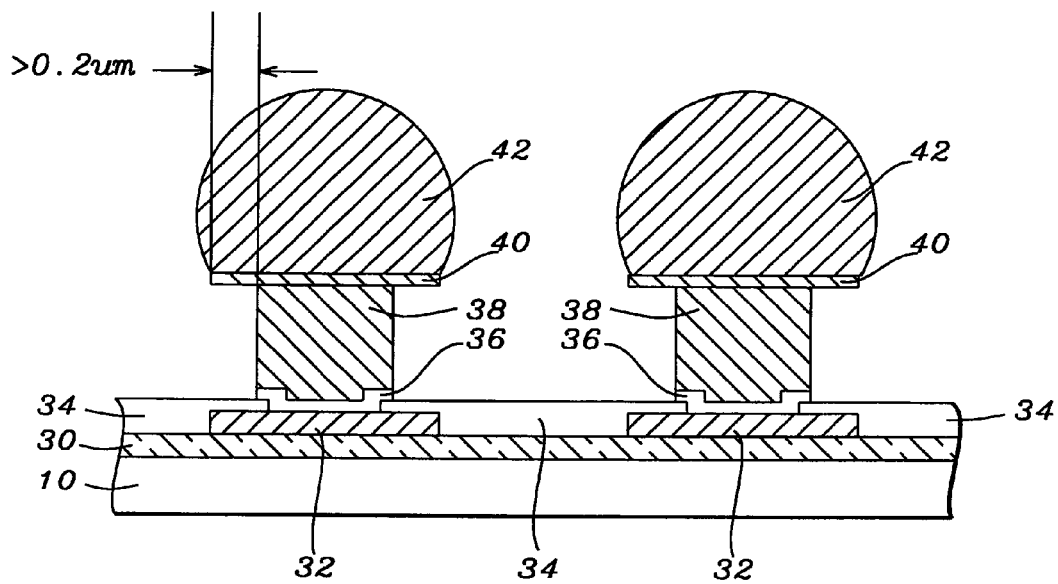

Referring now to FIG. 15, there is shown a cross section of a first solder bump that has been created in accordance with the above referenced related application. The elements that are shown in FIG. 15 that form part of the solder bump of the related application are the following:

10, a semiconductor surface such as the surface of a substrate
30, a layer of dielectric that has been deposited over the semiconductor surface 10
32, contact pads that have been created on the surface of the layer 30 of dielectric
34, a patterned layer of passivation that has been deposited over the surface of the layer 30 of dielectric; openings have been created in the layer 34 of passivation, partially exposing the surface of contact pads 32
36, an isotropically etched layer of barrier metal; this layer of barrier metal has been isotropically etched; that is, the barrier metal has been completely removed from the surface of the layer 34 of passivation except where the barrier metal is covered by the overlying pillar metal (38) of the solder bump
38, the pillar metal of the solder bump
40, a layer of under bump metal created overlying the pillar metal 38 of the solder bump, wherein the distance between an edge of the under bump metal layer and an edge of the metal pillar of the solder bump is greater than 0.2 microns
42, the solder metal.

Figure 16:
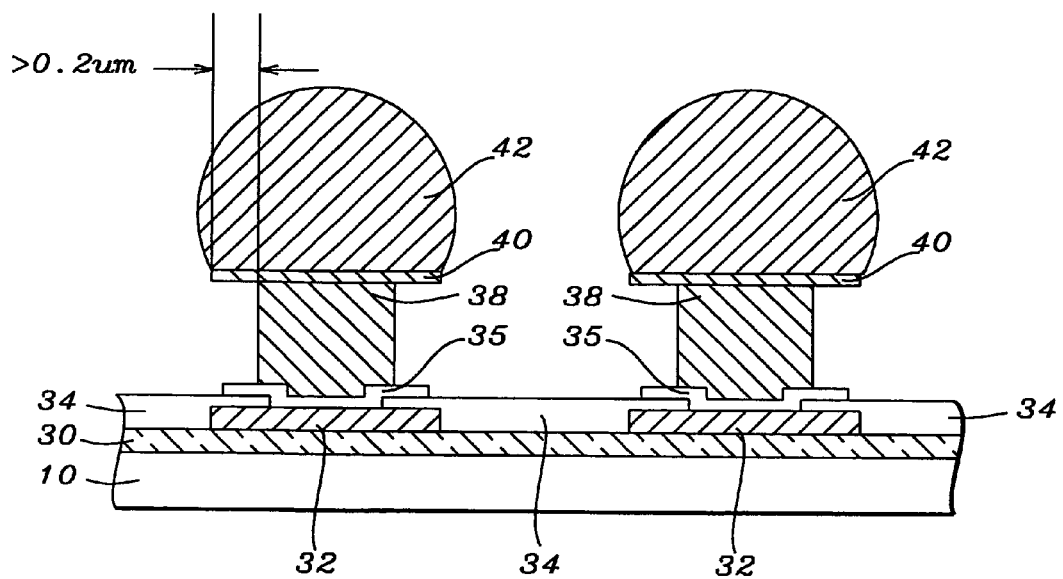

The cross section that is shown in FIG. 16 is similar to the cross section of FIG. 15 with the exception of layer 35, which is an anisotropically etched layer of barrier metal (etched after the solder bump 42 has been created) which, due to the nature of the anisotropic etch, protrudes from the pillar metal 38 as shown in the cross section of FIG. 16.

The cross sections that are shown in FIGS. 15 and 16 and that have been extracted from the above referenced related application have been shown in order to highlight that the referenced application provides of method of creating:

a fine-pitch solder bump
smaller solder bumps
a fine-pitch solder bump of high reliability due to the increased height of the solder bump
a cost-effective solder bump by using standard solder material and eliminating the need for expensive "low-α solder"
a solder bump that allows easy cleaning of flux after the process of flip chip assembly and before the process of underfill and encapsulation
a solder bump which allows easy application of underfill.

FIGS. 7 through 16 provide details of the process of the invention which leads to the solder bumps that have been shown in cross section in FIGS. 15 and 16.

FIG. 7 shows a cross section of substrate 10 on the surface, wherein he following elements are highlighted:

10, a silicon substrate over the surface of which metal contact pads 32 have been created
30, a layer of dielectric that has been deposited over the surface of substrate 10
32, the metal contact pads, typically comprising aluminum, created over the surface of the layer 30 of dielectric
34, a layer of passivation that has been deposited over the surface of the layer 30 of dielectric. Openings have been created in the layer 34 of passivation that align with the metal contact pads 32, partially exposing the surface of the contact pads 32
36, a layer of barrier metal that has been created over the surface of layer 34 of passivation, including the openings that have been created in the layer 34 of passivation, contacting the underlying contact pads 32.

As dielectric material for layer 30 can be used any of the typically applied dielectrics such as silicon dioxide (doped or undoped), silicon oxynitride, parylene or polyimide, spin-on-glass, plasma oxide or LPCVD oxide. The material that is used for the deposition of layer 30 of dielectric of the invention is not limited to the materials indicated above but can include any of the commonly used dielectrics in the art.

The creation of metal contact pads 32 can use conventional methods of metal rf sputtering at a temperature between about 100 and 400 degrees C. and a pressure between about 1 and 100 mTorr using as source, for instance, aluminum-copper material (for the creation of aluminum contact pads) at a flow rate of between about 10 and 400 sccm to a thickness between about 4000 and 11000 Angstroms. After a layer of metal has been deposited, the layer must be patterned and etched to create the aluminum contact pads 32. This patterning and etching uses conventional methods of photolithography and patterning and etching. A deposited layer of AlCu can be etched using $Cl_2$/Ar as an etchant at a temperature between 50 and 200 degrees C., an etchant flow rate of about 20 sccm for the $Cl_2$ and 1000 sccm for the Ar, a pressure between about 50 mTorr and 10 Torr, a time of the etch between 30 and 200 seconds.

In a typical application insulating layers, such as silicon oxide and oxygen-containing polymers, are deposited using Chemical Vapor Deposition (CVD) technique over the surface of various layers of conducting lines in a semiconductor device or substrate to separate the conductive interconnect lines from each other. The insulating layers can also be deposited over patterned layers of interconnecting lines; electrical contact between successive layers of interconnecting lines is established with metal vias created in the insulating layers. Electrical contact to the chip is typically established by means of bonding pads or contact pads that form electrical interfaces with patterned levels of interconnecting metal lines. Signal lines and power/ground lines can be connected to the bonding pads or contact pads. After the bonding pads or contact pads have been created on the surfaces of the chip, the bonding pads or contact pads are passivated and electrically insulated by the deposition of a passivation layer over the surface of the bonding pads. A passivation layer can contain silicon oxide/silicon nitride ($SiO_2/Si_3N_4$) deposited by CVD. The passivation layer is patterned and etched to create openings in the passivation layer for the bonding pads or contact pads after which a second and relatively thick passivation layer can be deposited for further insulation and protection of the surface of the chips from moisture and other contaminants and from mechanical damage during assembling of the chips.

Various materials have found application in the creation of passivation layers. The passivation layer can contain silicon oxide/silicon nitride ($SiO_2/Si_3N_4$) deposited by CVD, or a passivation layer can be a layer of photosensitive polyimide or can comprise titanium nitride. Another material often used for a passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure which have been highlighted above. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross-linked, thereby leaving unexposed regions (that are not cross-linked) over the bonding pads. During subsequent development, the unexposed polyimide precursor layer (over the bonding pads) is dissolved, thereby providing openings over the bonding pads. A final step of thermal curing leaves a permanent high quality passivation layer of polyimide over the substrate.

The preferred material of the invention for the deposition of layer 34 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 32 of PE $Si_3N_4$ can be deposited to a thickness between about 200 and 800 Angstroms.

Layer 34 of PE $Si_3N_4$ is next patterned and etched to create openings in the layer 34 that overlay and align with the underlying contact pads 32.

The etching of layer 34 of passivation can use Ar/$CF_4$ as an etchant at a temperature of between about 120 and 160 degrees C. and a pressure of between about 0.30 and 0.40 Torr for a time of between about 33 and 39 seconds using a dry etch process.

The etching of layer 34 of passivation can also use He/$NF_3$ as an etchant at a temperature of between about 80 and 100 degrees C. and a pressure of between about 1.20 and 1.30 Torr for a time of between about 20 and 30 seconds using a dry etch process.

Barrier layers, such as layer 36, are typically used to prevent diffusion of an interconnect metal into surrounding layers of dielectric and silicon. Some of the considerations that apply in selecting a material for the barrier layer become apparent by using copper for interconnect metal as an example. Although copper has a relatively low cost and low resistivity, it has a relatively large diffusion coefficient into silicon dioxide and silicon and is therefore not typically used as an interconnect metal. Copper from an interconnect may diffuse into the silicon dioxide layer causing the dielectric to be conductive and decreasing the dielectric strength of the silicon dioxide layer. Copper interconnects should be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes a desired increase in capacitance between the interconnect and the substrate.

A typical diffusion barrier layer may contain silicon nitride, phosphosilicate glass (PSG), silicon oxynitride, aluminum, aluminum oxide ($Al_xO_y$), tantalum, Ti/TiN or Ti/W, nionbium, or molybdenum and is more preferably formed from TiN. The barrier layer can also be used to improve the adhesion of the subsequent overlying tungsten layer.

A barrier layer is preferably between about 500 and 2000 Angstroms thick and more preferably about 300 Angstroms thick and can be deposited using rf sputtering.

After the creation of barrier layer 36, a seed layer (not shown in FIG. 7) can be blanket deposited over the surface of the wafer. For a seed layer that is blanket deposited over the surface of the wafer any of the conventional metallic seed materials can be used. The metallic seed layer can be deposited using a sputter chamber or an Ion Metal Plasma (IMP) chamber at a temperature of between about 0 and 300 degrees C. and a pressure of between about 1 and 100 mTorr, using (for instance) copper or a copper alloy as the source (as highlighted above) at a flow rate of between about 10 and 400 sccm and using argon as an ambient gas.

Figure 8:
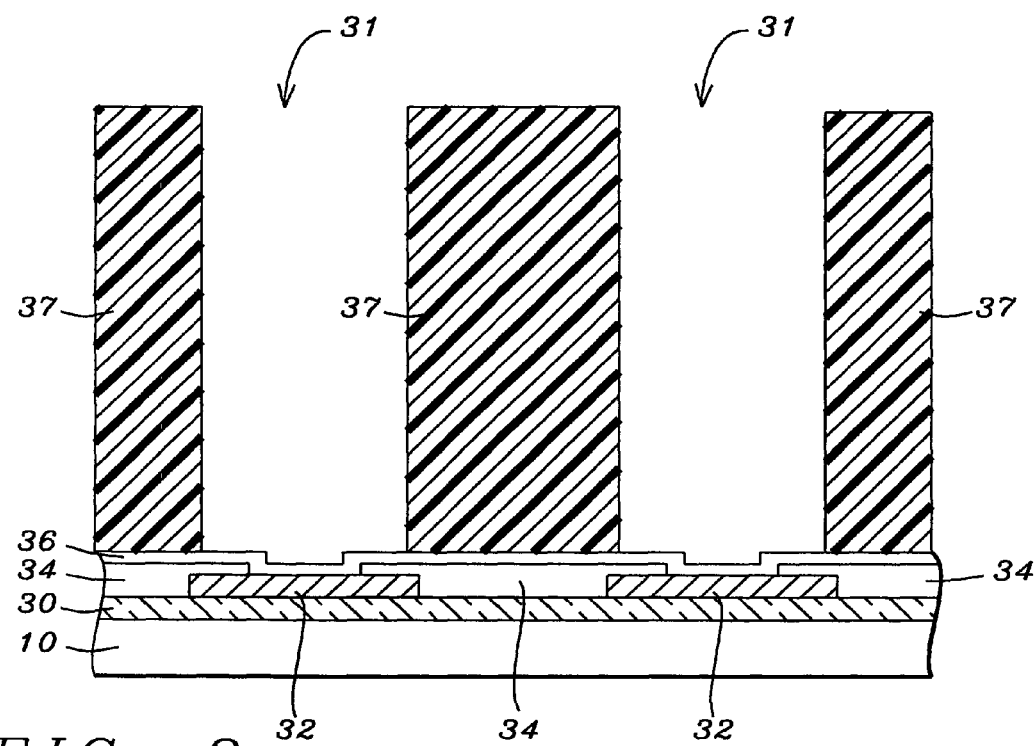

FIG. 8 shows a cross section of the substrate after a layer 37 of photoresist has been deposited over the surface of the barrier layer 36. The layer 37 of photoresist has been patterned and etched, creating openings 31 in the layer 37 of photoresist. Openings 31 partially expose the surface of the barrier layer 36. Layer 37 of photoresist is typically applied to a thickness of between about 100 and 200 μm but more preferably to a thickness of about 150 μm.

Layer 37 of photoresist is typically applied to a thickness of between about 100 and 200 µm but more preferably to a thickness of about 150 µm. The methods used for the deposition and development of the layer 37 of photoresist uses conventional methods of photolithography. Photolithography is a common approach wherein patterned layers are formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered soluble (positive working) and washed away, or insoluble (negative working) and form the pattern.

The deposited layer 37 of photoresist can, prior to patterning and etching, be cured or pre-baked further hardening the surface of the layer 37 of photoresist.

Layer 37 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 37 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Figure 9:
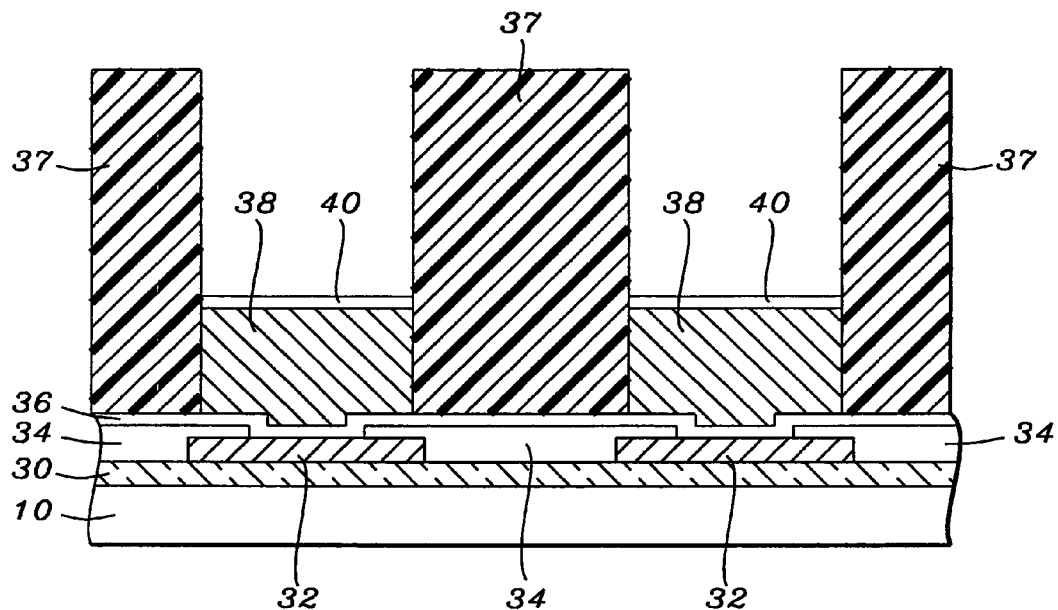

FIG. 9 shows a cross section of the substrate 10 after a layer 38 of pillar metal has been deposited (electroplated) over the surface of the layer 36 of barrier material and bounded by openings 31 that have been created in the layer 37 of photoresist. Over the surface of the layers 38 of metal, which will be referred to as pillar metal in view of the role these layers play in the completed structure of the solder bumps of the invention, layers 40 of under bump metal have been deposited using deposition methods such as electroplating.

Layer 36 preferably comprises titanium or copper and is preferably deposited to a thickness of between about 500 and 2000 Angstroms and more preferably to a thickness of about 1000 Angstroms.

Layer 38 preferably comprises copper and is preferred to be applied to a thickness of between about 10 and 100 µm but more preferably to a thickness of about 50 µm.

Layer 40 preferably comprises nickel and is preferred to be applied to a thickness of between about 1 and 10 µm but more preferably to a thickness of about 4 µm.

Figure 10:
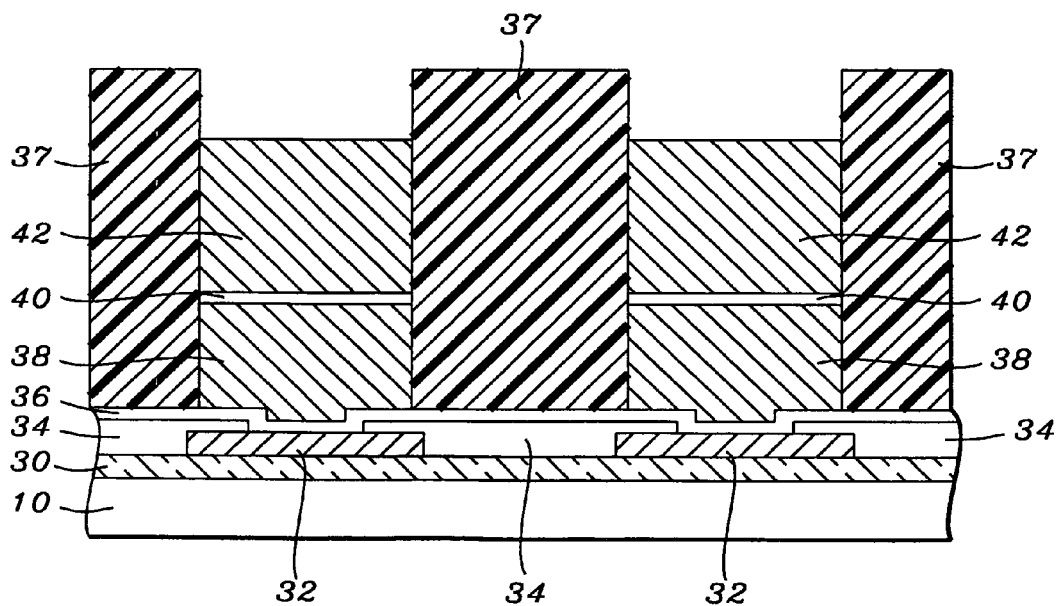

FIG. 10 shows a cross section where the process of the invention has further electroplated layers 42 of solder metal over the surface of layers 40 of under bump metal (UBM) and bounded by the openings 31 that have been created in the layer 37 of photoresist.

Layer 40 of UBM, typically of nickel and of a thickness between about 1 and 10 µm, is electroplated over the layer 38 of pillar metal. The layer 42 of bump metal (typically solder) is electroplated in contact with the layer 40 of UBM to a thickness of between about 30 and 100 µm but more preferably to a thickness of about 50 µm. The layers 38, 40 and 42 of electroplated metal are centered in the opening 31 that has been created in the layer 37 of photoresist.

Figure 11:
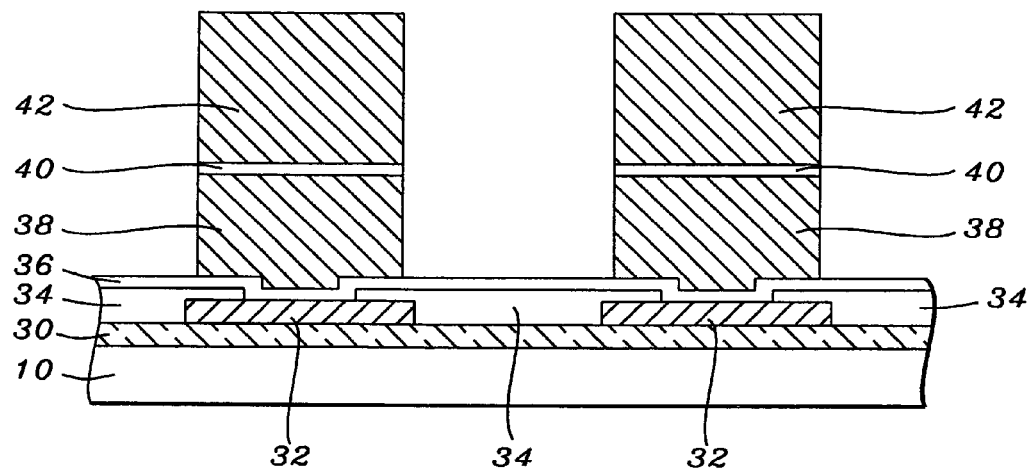
Figure 12:
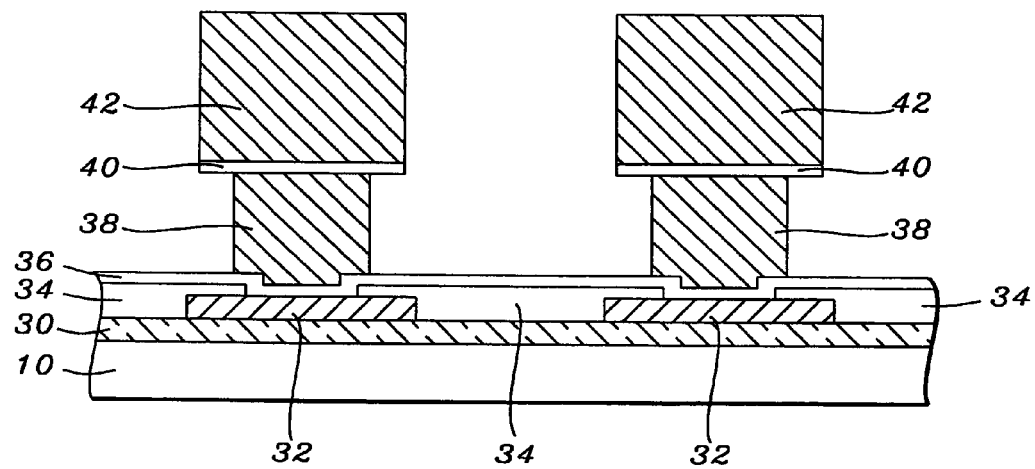

In the cross section that is shown in FIG. 11, it is shown that the patterned layer 37 of photoresist has been removed from above the surface of the barrier layer 36. The previously highlighted methods and processing conditions for the removal of a layer of photoresist can be applied for the purpose of the removal of layer 37 that is shown in cross section in FIG. 11. The invention further proceeds with the partial etching of the pillar metal 38, as shown in cross section in FIG. 12, using methods of wet chemical etching or an isotropic dry etch, selective to the pillar metal material. It is clear that, by adjusting the etching parameters, of which the time of etch is most beneficial, the diameter of the pillar metal 38 can be reduced by almost any desired amount. The limitation that is imposed on the extent to which the diameter of the pillar metal 38 is reduced is not imposed by the wet etching process but by concerns of metal bump reliability and functionality. Too small a remaining diameter of the pillar metal 38 will affect the robustness of the solder bumps while this may also have the effect of increasing the resistance of the metal bump.

Figure 13:
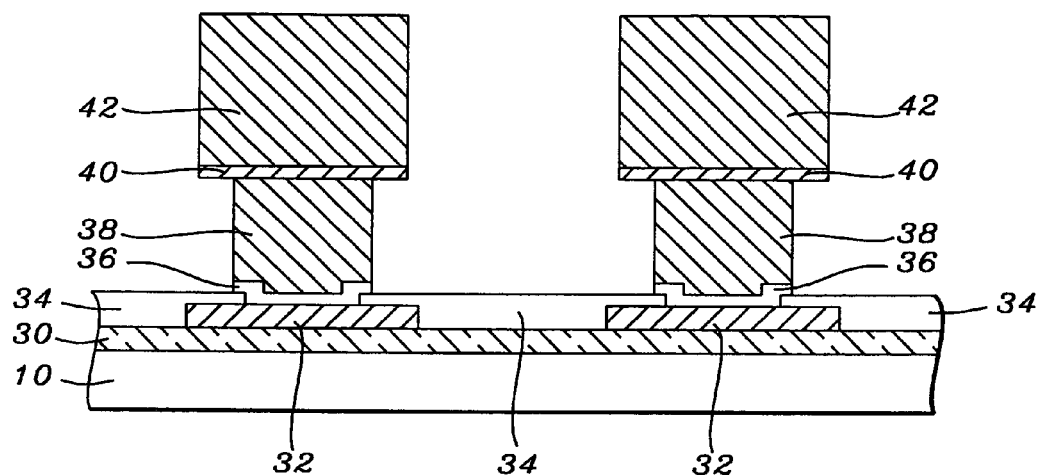
Figure 14:
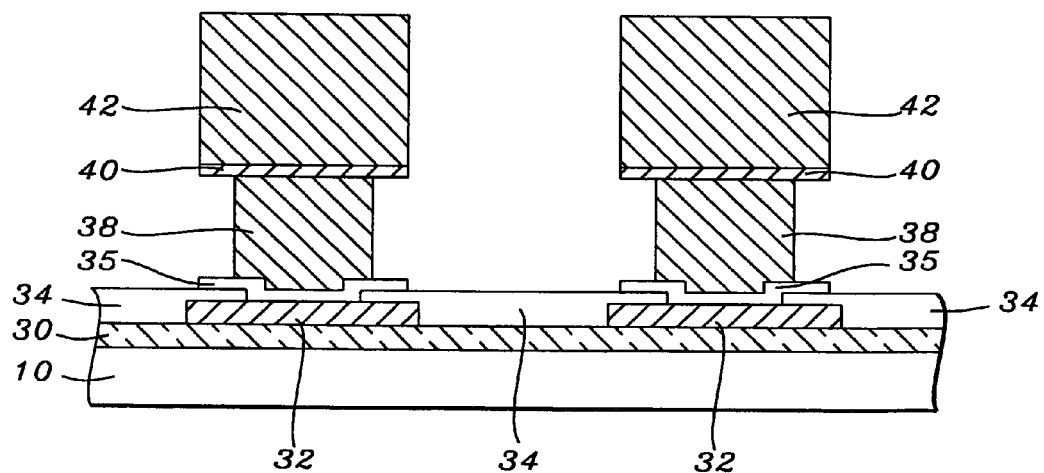

The final two processing steps of the invention, before the solder metal is reflowed, are shown in the cross section of FIGS. 13 and 14 and affect the etching of the exposed surface of the barrier layer 36. Using isotropic etching, the exposed barrier layer is completely removed as is shown in FIG. 13. Using anisotropic etching, in FIG. 14, the etching of the barrier layer is partially impeded by the presence of the columns 42 of solder metal.

It is believed that the undercut shape of pillar 38 will prevent wetting of pillar 38 and the UBM layer 40 during subsequent solder reflow. It is also believed that exposure to air will oxidize the sidewalls of pillar 38 and UBM layer 40 and therefore prevent wetting of these surfaces during subsequent solder reflow. Optionally, the sidewalls of pillar 38 and UBM layer 40 may be further oxidized by, for example, a thermal oxidation below reflow temperature of about 240 degrees C. such as heating in oxygen ambient at about 125 degrees C.

FIGS. 15 and 16 show the final cross section of the solder bump of the invention after the solder metal has been reflowed. FIG. 15 corresponds to FIG. 13 while FIG. 16 corresponds to FIG. 14, this relating to the etch in the barrier layer 36 that has been explained using FIGS. 13 and 14. It is noted that the etched layer 36 of barrier material that is shown in cross section in FIG. 15 corresponds to the etched layer of barrier material that is shown in FIG. 13. The same correspondence exists between FIGS. 16 and 14.

The above summarized processing steps of electroplating that are used for the creation of a metal bump can be supplemented by the step of curing or pre-baking of the layer of photoresist after this layer has been deposited.

To review and summarize the invention:
prior to and in preparation for the invention, a semiconductor surface is provided, a layer of dielectric has been deposited over the semiconductor surface, a contact pad has been provided on the layer of dielectric, the contact pad has an exposed surface, a layer of passivation has been deposited over a semiconductor surface including the surface of said contact pad, and the layer of passivation has been patterned and etched, creating an opening in the layer of passivation, partially exposing the surface of the contact pad, the opening in the layer of passivation is centered with respect to the contact pad the invention starts with a barrier layer deposited over the surface of the layer of passivation, making contact with the contact pad through the opening created in the layer of passivation a layer of photoresist is deposited over the surface of the barrier layer the layer of photoresist is patterned and etched, creating an opening through the layer of photoresist, wherein the opening in the layer of photoresist aligns with and is centered with respect to the contact pad in sequence are deposited, bounded by the opening created in the layer of photoresist, a layer of pillar metal, a layer of under bump metal and a layer of solder metal the patterned layer of photoresist is removed from the surface of the barrier layer the layer of pillar metal is etched, reducing the diameter of the pillar metal the barrier layer is etched, using either isotropic or anisotropic etching the solder metal is reflowed.

Figure 17:
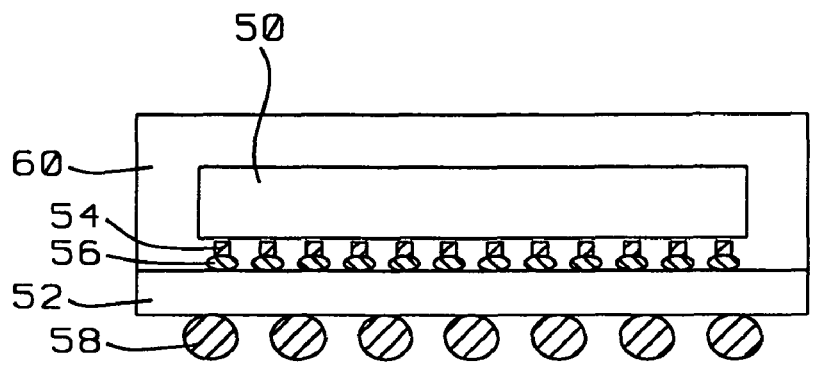
FIG. 17 shows a cross section of the BGA package of the invention; the semiconductor device is encapsulated in a molding compound.

The invention offers the following advantages:

ball height is a very important reliability concern; in order to prevent thermal mismatch between overlying layers of a package (such as a semiconductor device and an underlying printed circuit board and the like) it is important to increase the distance between overlying elements; the invention provides this ability a larger solder ball (for better thermal or reliability performance) results in increased pitch; this is contrary to state of the art design requirements if small solder balls are used without providing height, it is very difficult to underfill the small gaps the solder is, using the invention, relatively far removed from the semiconductor device which means that the application of low-alpha solder is not required (alpha-particles create soft errors in memory products; lead is known to emit alpha-particles when lead decays)

for the pillar metal a metal needs to be selected that has good conductivity and good ductility, such as copper. This is in order to provide improved thermal performance by counteracting thermal stress the height of the pillar of the solder bump of the invention is important and should be between about 10 to 100 μm in order to achieve objectives of high stand-off the metal that is used for the under bump metal layer is important in that this metal must have good adhesion with the overlying solder during solder reflow while this metal must not solve too fast and in so doing form a barrier to the solder; in addition, the UBM metal when exposed to air can form a layer of protective oxide thus preventing solder wetting to the pillar metal around the perimeter of the UBM metal during the reflow process; nickel is therefore preferred for the UBM metal Now the packaging of the invention using the solder bumps described above will be discussed. Referring now to the cross section that is shown in FIG. 17, there is shown a cross section of the BGA package of the invention whereby the semiconductor device has been encapsulated in a molding compound. The elements that are highlighted in the cross section of FIG. 5 are the following:

50, a semiconductor device that is mounted in the package of the invention shown in cross section in FIG. 17

52, the (BGA) substrate on the surface of which device 50 is mounted

54, the pillar metal of the interface between the device 50 and the BGA substrate 52, similar to pillar metal 38 of FIGS. 15 and 16

56, the solder bump of the interface between the device 50 and the BGA substrate 52, similar to solder bump 42 of FIGS. 15 and 16

58, the contact balls that are used to interconnect the package of the invention with surrounding circuitry

60, molding compound into which the device 50 is embedded for protection against the environment.

The columns 54 of pillar metal typically have a height of between about 10 and 100 μm and more preferably about 50 μm.

Figure 18:
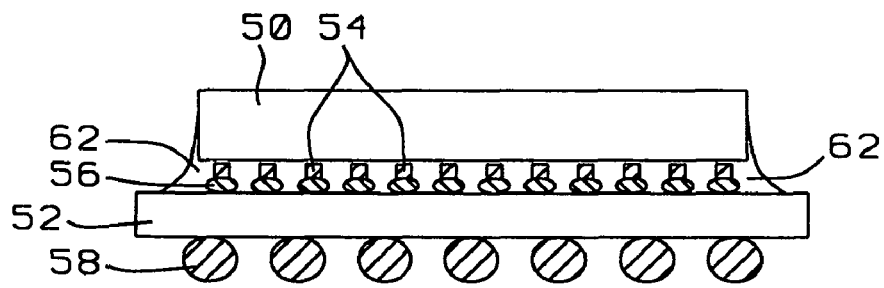
FIG. 18 shows a cross section of the BGA package of the invention; underfill is provided to the semiconductor device.

The cross section that is shown in FIG. 18 is identical to the cross section of FIG. 17 with the exception of the underfill 62 which is used instead of the molding compound 60 of FIG. 17.

The following comment applies: the creation of the pillar metal 54 and the solder bump 56 starts using the I/O contact pads of device 50 (not shown in FIGS. 17,18) as the contact pads; that is the I/O contact pads of device 50 take the place of the contact pad 32 of FIGS. 15 and 16 in the creation of the pillar metal 54 and the solder bump 56. The process of creating the pillar metal 54 and the solder bump 56 therefore is as follows:

a layer of dielectric is deposited over the active surface of device 50; the active surface of device 50 is the surface in which I/O contact points have been provided; this surface will face the BGA substrate 52 after mounting of the device 50 on BGA substrate 52 openings are created in the layer of dielectric, exposing the I/O contact pads of device 50; this brings the process of the invention to the point of the related application where contact pads 32 (FIGS. 15, 16) have been created on the surface of the layer 30 of dielectric a layer of passivation is deposited over the surface of the layer of dielectric, similar to layer 34, FIGS. 15, 16 openings are created in the layer of passivation, partially exposing the surface of the device I/O contact pads a barrier layer is deposited over the surface of the layer of passivation, identical to layer 36, FIGS. 15, 16 the pillar metal 54 of the solder bump is formed, identical to layer 38, FIGS. 15, 16 the layer of under bump (not shown in FIGS. 17, 18) is created overlying the pillar metal, identical to layer 40, FIGS. 15, 16 the solder bump 56 is formed, identical to layer 42, FIGS. 15, 16 the layer of barrier metal is isotropically (FIG. 15) or anisotropically (FIG. 16) etched.

Figure 19:
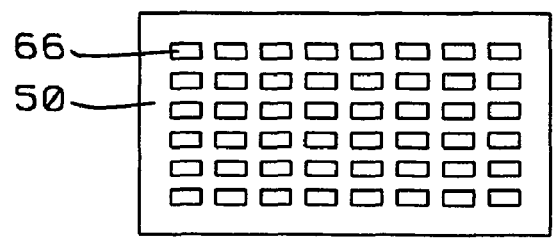
FIG. 19 shows a top view of an array type I/O pad configuration of a semiconductor device.

Referring now to FIG. 19, there is shown a top view of an array type arrangement of I/O contact points 66 that form the contact points of device 50. This top view of the array type contact points 66 is shown as one example of where the process of creating pillar metal and solder bumps can be applied.

Figure 20:
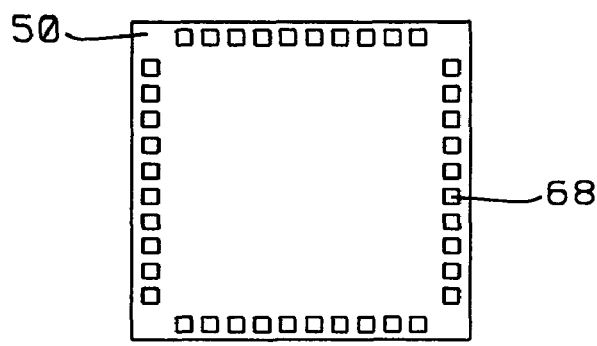
FIG. 20 shows a top view of a peripheral type I/O pad configuration of a semiconductor device.
Figure 21:
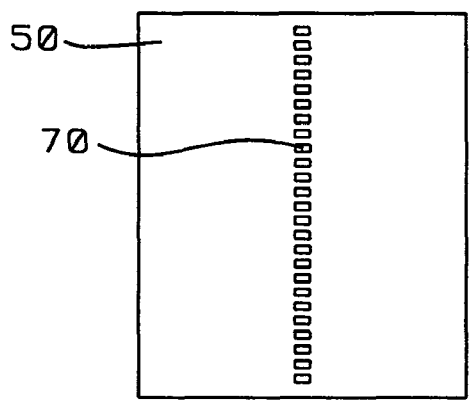
FIG. 21 shows a top view of a center type I/O pad configuration of a semiconductor device.

FIGS. 20 and 21 show two more examples of arrangements of I/O contact pads that are provided on the surface of device 50, where the process of the invention can be applied. FIG. 20 shows a peripheral I/O pad design 68 while FIG. 21 shows a center type pad design 70.

Figure 22:
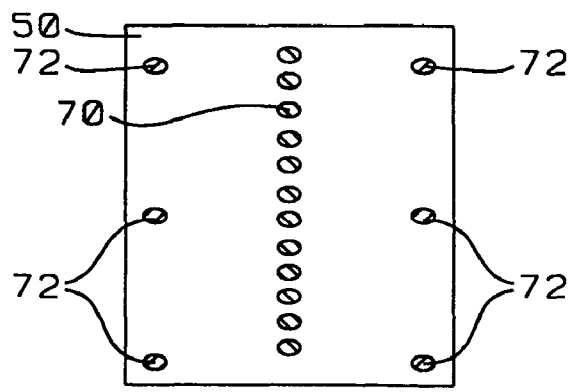
FIG. 22 shows a top view of a center type I/O pad configuration of a semiconductor device; dummy solder bumps have been provided in support of the semiconductor device.

While the peripheral I/O pad design that is shown in FIG. 20 provides evenly distributed mechanical support for device 50, this is not the case for the center pad design that is shown in FIG. 21. For this kind of design, additional mechanical support can be provided to device 50; this is shown in top view in FIG. 22. The elements highlighted as 70 in FIG. 22 are the solder bumps that have been created on the I/O contact pads of device 50; elements 72 are dummy solder bumps that can be provided in order to lend mechanical support to device 50. The symmetry of the dummy bumps 72 as shown in FIG. 22 makes clear that device 50 is, with the dummy bumps 72, adequately and symmetrically supported.

Figure 23:
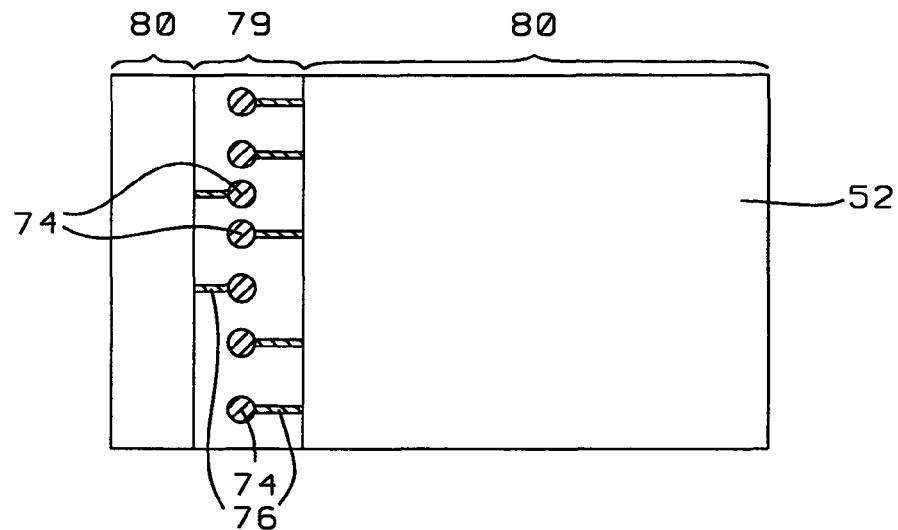
FIG. 23 shows a top view of the substrate with exposed I/O contact pads; this exposure is accomplished by not depositing the solder mask in close proximity to the contact pads of the substrate.

In mounting semiconductor devices on the surface of a BGA substrate, it is important from a manufacturing point of view that solder flux, after the process of solder flow has been completed, can be readily removed. This requires easy access to the surface areas of the BGA substrate where solder flux has been able to accumulate. In addition, the device interconnects (consisting of pillar metal and solder bumps) must, after the pillar metal and the solder bumps have been formed in accordance with the related application, be readily available so that device encapsulants can be adequately applied. More importantly, after flip-chip assembly and solder reflow, the flux that has accumulated in the gap between the semiconductor die and the substrate must be cleaned. For these reasons, it is of value to apply the solder mask not across the entire surface of the substrate (blank deposition) but to leave open the surface areas of the substrate that are immediately adjacent to the I/O interconnects (of pillar metal and solder bumps). This design will create a channel though which the cleaning solution can flow easily. This is highlighted in the top view of FIGS. 23 and 24, where is shown:

- 52, the BGA substrate on the surface of which device 50 (not shown) is mounted
- 74, I/O contact pads provided on the surface of substrate 52
- 76, interconnect traces provided on the surface of substrate 52, connected with contact pads 74
- 79, the surface region of the substrate 52 over which no solder mask is applied
- 80, the surface region of the substrate 52 over which a solder mask is applied.

Figure 24:
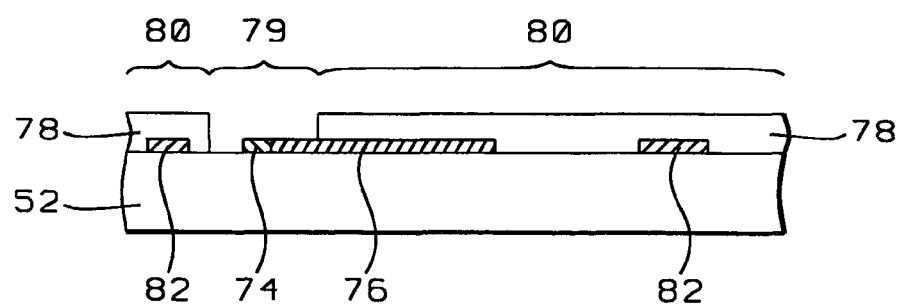
FIG. 24 shows a cross section of the substrate of FIG. 23.

This is further highlighted in the cross section of substrate 52 that is shown in FIG. 24. It is clear that over the region 79, which is the region where no solder mask is applied, the metal pads 74 are readily available so that removal of solder flux and the dispensing of encapsulants can be performed. It must be remembered that this is possible due to the height of the combined pillar metal 54 and the solder bump 56, which results in adequate spacing between the device 50 and the surface of substrate 52. Further shown in FIG. 24 are routing traces 82 that are provided on the surface of substrate 52 for additional interconnect.

FIGS. 25 and 26 show how prior art procedures and conventions are applied to affect flux removal and encapsulant application. In the prior art application, the metal pads 74 are typically surrounded by the solder mask 78, even for small pitch I/O pad designs. Typically, the solder mask is determined by the type of contact pad design (FIGS. 19 through 21), whereby the contact pads 74 require about 60 μm clearance for reasons of proper alignment registration. This results in the substrate design rule being more critical, allowing for less error and smaller tolerance in the design parameters. In addition, the height of the solder mask 78 is generally about 10 μm larger than the height of the contact pad 74, further forming an obstacle in applying molding compound or in removing flux after the solder process has been completed. These aspects of the prior art are shown in FIGS. 25 and 26, where the metal pads 74 are completely surrounded by the solder mask 78. The present invention negates the highlighted negative effects of the solder mask on flux cleaning and on dispensing molding compound.

Figure 27A:
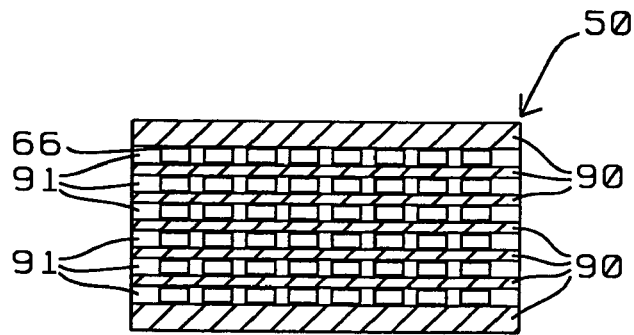
FIGS. 27*a* through 27*f* show examples of applications of the invention.

FIGS. 27a through 27f show examples of applications of the invention, as follows:

FIG. 27a shows the application of a solder mask projected over the surface of the semiconductor device 50 that has previously been shown in FIG. 19, the solder mask has been indicated with hatched regions 90, and the regions where no solder mask is present have been highlighted with 91.

Figure 27B:
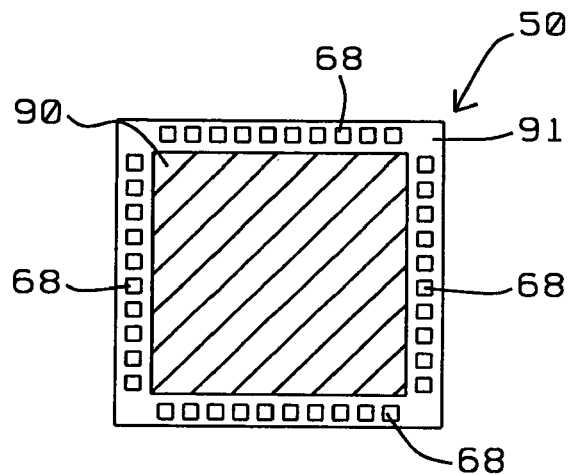
Figure 27C:
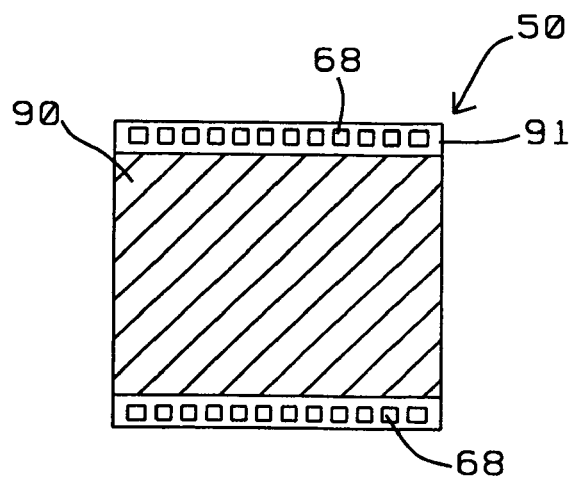

FIGS. 27b and 27c relate to the previous FIG. 20, and the solder mask projected over the surface of the semiconductor device 50 has been highlighted as regions 90 while the regions where no solder mask is present have been highlighted with 91. The design that is shown in FIG. 27c is considered a "partial" peripheral type I/O pad configuration of a semiconductor device since the I/O pads 68 are only provided along two opposing sides of the semiconductor device 50.

It must be noted that the designs that are shown in FIGS. 27b and 27c can further be provided with supporting dummy solder bumps in the regions of the solder mask 90, these supporting solder bumps have not been shown in FIGS. 27b and 27c.

Figure 27D:
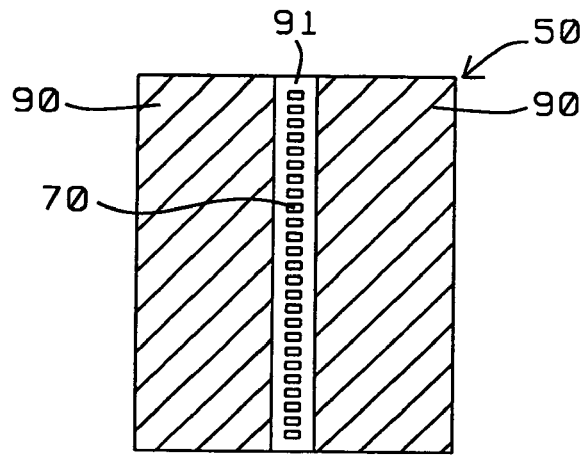
Figure 27E:
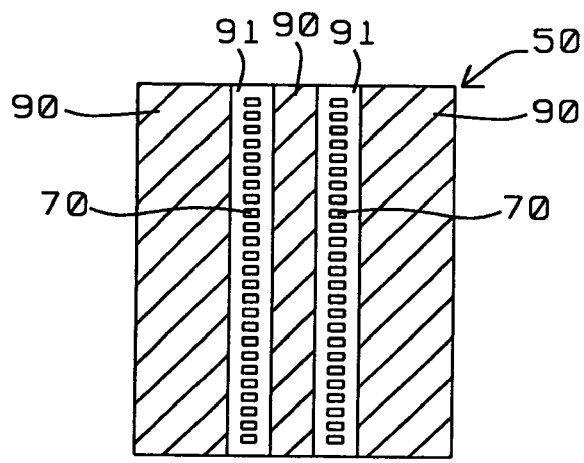

FIG. 27d shows the design that has previously been shown in FIG. 21, FIG. 27e shows a design that is similar to the design of FIG. 27d with the exception that the contact points 70 have now been provided in two columns. It is clear from these two drawings that channels have been created in the solder mask that are in line with and include the contact pads. These channels allow for easy flow of cleaning fluid and therefore allow for easy removal of solder flux after the process of chip encapsulation and solder flow has been completed.

Figure 27F:
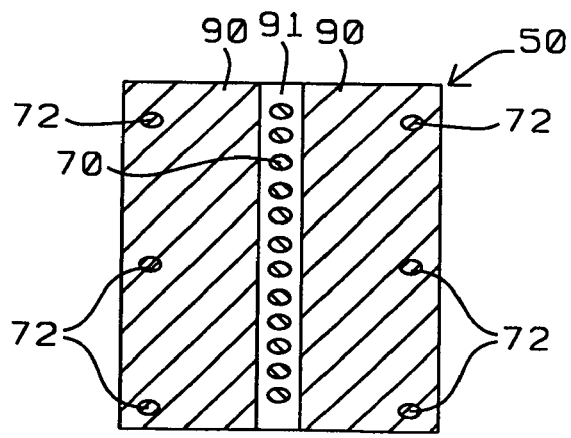

FIG. 27f relates to the previously shown FIG. 22, the above observation relating to the creation of a channel through the solder flux and the therefrom following easy flow of cleaning fluid equally applies to the design that is shown in FIG. 27f.

FIGS. 28a and 28b demonstrate how the invention leads to the ability to reduce the pitch between I/O pads.

FIG. 28a shows how in prior art applications the solder mask 90 is provided, further shown in FIG. 28a are:

- 94, the circumference of the opening that is created in the solder mask 90
- 95, the circumference of the bond pad on the surface of a substrate,
- 92, the distance (or spacing) S between two adjacent contact pads
- 93, the diameter D of a contact pad.

In prior art applications as shown in FIG. 28a, the pitch between adjacent contact pads is P=D+S+2×(the required clearance between adjacent contact pads). The required clearance is needed by the solder mask and requires that extra space is required between the circumference 95 of the contact pad and the circumference 94 of the opening created in the solder mask.

With the wide channel created by the invention through the solder mask, highlighted as channel 91 in FIG. 28b, the conventional clearance is not required, resulting in the ability to reduce the pitch between adjacent contact pads 95. This leads to a distance 92', FIG. 28b, which is smaller than distance 92 of FIG. 28a.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A chip package comprising:
   a substrate comprising a solder mask, a first contact point in a channel in said solder mask, a second contact point in said channel, wherein said first contact point is separate from said second contact point in said channel, wherein said channel has a first sidewall and a second sidewall opposite to and substantially parallel with said first sidewall, and an interconnect covered by said solder mask;
a semiconductor device comprising a polymer layer at a top of said semiconductor device and a metal pad having a third contact point at a bottom of an opening in said polymer layer;
a copper pillar between said third contact point and said substrate, wherein said copper pillar is connected to said third contact point through said opening, wherein said copper pillar has a thickness between 10 and 100 micrometers;
a solder between said copper pillar and said substrate, wherein said solder is connected to said copper pillar, wherein said solder electrically contacts said first contact point; and
an underfill between said semiconductor device and said substrate, wherein said underfill contacts said semiconductor device and said substrate, wherein said copper pillar has a sidewall with a bottom edge not covered by said solder, but covered by said underfill.

2. The chip package of claim 1 further comprising a nickel-containing layer between said copper pillar and said solder, wherein said nickel-containing layer is connected to said copper pillar and said solder.

3. The chip package of claim 2, wherein said nickel-containing layer has a thickness between 1 and 10 micrometers.

4. The chip package of claim 1 further comprising a titanium-containing layer between said copper pillar and said third contact point, wherein said copper pillar is connected to said third contact point through said titanium-containing layer.

5. The chip package of claim 4, wherein said titanium-containing layer comprises a titanium-tungsten alloy.

6. The chip package of claim 1, wherein said copper pillar is further over a top surface of said polymer layer.

7. A chip package comprising:
a substrate comprising a solder mask, a first contact point in a channel in said solder mask, a second contact point in said channel, wherein said first contact point is separate from said second contact point in said channel, wherein said channel has a first sidewall and a second sidewall opposite to and substantially parallel with said first sidewall, and an interconnect covered by said solder mask;
a semiconductor device comprising a polymer layer at a top of said semiconductor device and a metal pad having a third contact point at a bottom of an opening in said polymer layer;
a copper pillar between said third contact point and said substrate and over a top surface of said polymer layer, wherein said copper pillar is connected to said third contact point through said opening, wherein said copper pillar has a thickness between 10 and 100 micrometers;
a titanium-containing layer between said third contact point and said copper pillar, wherein said titanium-containing layer is on said third contact point, on said top surface of said polymer layer and in said opening, wherein said copper pillar is connected to said third contact point through said titanium-containing layer;
a solder between said copper pillar and said substrate, wherein said solder is connected to said copper pillar, wherein said solder electrically contacts said first contact point;
a nickel-containing layer between said copper pillar and said solder, wherein said nickel-containing layer is connected to said copper pillar and said solder; and
an underfill between said semiconductor device and said substrate, wherein said underfill contacts said semiconductor device and said substrate, wherein said copper pillar has a sidewall with a bottom edge not covered by said solder, but covered by said underfill.

8. The chip package of claim 7, wherein said nickel-containing layer has a thickness between 1 and 10 micrometers.

9. The chip package of claim 7, wherein said polymer layer comprises polyimide.

10. The chip package of claim 7, wherein said titanium-containing layer comprises titanium nitride.

11. The chip package of claim 7, wherein said titanium-containing layer comprises a titanium-tungsten alloy.

12. A chip package comprising:
a substrate comprising a solder mask, a first contact point in a channel in said solder mask, a second contact point in said channel, wherein said first contact point is separate from said second contact point in said channel, wherein said channel has a first sidewall and a second sidewall opposite to and substantially parallel with said first sidewall, and an interconnect covered by said solder mask;
a semiconductor device comprising a passivation layer at a top of said semiconductor device and a metal pad having a third contact point at a bottom of an opening in said passivation layer;
a copper pillar between said third contact point and said substrate, wherein said copper pillar is connected to said third contact point through said opening, wherein said copper pillar has a thickness between 10 and 100 micrometers;
a solder between said copper pillar and said substrate, wherein said solder is connected to said copper pillar, wherein said solder electrically contacts said first contact point; and
an underfill between said semiconductor device and said substrate, wherein said underfill contacts said semiconductor device and said substrate, wherein said copper pillar has a sidewall with a bottom edge not covered by said solder, but covered by said underfill.

13. The chip package of claim 12, wherein said passivation layer comprises silicon nitride.

14. The chip package of claim 12 further comprising a nickel-containing layer between said copper pillar and said solder, wherein said nickel-containing layer is connected to said copper pillar and said solder.

15. The chip package of claim 14, wherein said nickel-containing layer has a thickness between 1 and 10 micrometers.

16. The chip package of claim 12 further comprising a titanium-containing layer between said copper pillar and said third contact point, wherein said copper pillar is connected to said third contact point through said titanium-containing layer.

17. The chip package of claim 12, wherein said copper pillar is further over a top surface of said passivation layer.

18. A chip package comprising:
a substrate comprising a solder mask, a first contact point, a second contact point separate from said first contact point, and an interconnect covered by said solder mask, wherein none of said solder mask is between said first and second contact points;
a semiconductor device comprising a polymer layer at a top of said semiconductor device and a metal pad having a third contact point at a bottom of an opening in said polymer layer;
a copper pillar between said third contact point and said substrate, wherein said copper pillar is connected to said third contact point through said opening, wherein said copper pillar has a thickness between 10 and 100 micrometers;
a solder between said copper pillar and said substrate, wherein said solder is connected to said copper pillar, wherein said solder electrically contacts said first contact point; and
an underfill between said semiconductor device and said substrate, wherein said underfill contacts said semiconductor device and said substrate, wherein said copper pillar has a sidewall with a bottom edge not covered by said solder, but covered by said underfill.

19. The chip package of claim 18 further comprising a titanium-containing layer between said copper pillar and said third contact point, wherein said copper pillar is connected to said third contact point through said titanium-containing layer.

20. The chip package of claim 19, wherein said titanium-containing layer comprises a titanium-tungsten alloy.

21. The chip package of claim 18 further comprising a nickel-containing layer between said copper pillar and said solder, wherein said nickel-containing layer is connected to said copper pillar and said solder.

22. The chip package of claim 21, wherein said nickel-containing layer has a thickness between 1 and 10 micrometers.

23. The chip package of claim 18, wherein said copper pillar is further over a top surface of said polymer layer.

24. A chip package comprising:
a semiconductor device comprising multiple first contact pads arranged along a first edge of said semiconductor device and in a peripheral region of said semiconductor device, multiple second contact pads arranged along a second edge of said semiconductor device and in said peripheral region, wherein said first edge is opposite to said second edge, multiple third contact pads arranged along a third edge of said semiconductor device and in said peripheral region, and multiple fourth contact pads arranged along a fourth edge of said semiconductor device and in said peripheral region, wherein said third edge is opposite to said fourth edge;
a solder mask over said semiconductor device, wherein no solder mask is between any neighboring two of said multiple first contact pads from a top perspective view;
a circuit substrate over said semiconductor device;
multiple metal bumps between said circuit substrate and said multiple first, second, third and fourth contact pads, wherein one of said multiple metal bumps comprises a copper pillar having a thickness between 10 and 100 micrometers, and a solder between said copper pillar and said circuit substrate, wherein said solder joins said circuit substrate and is connected to said copper pillar; and
an underfill between said semiconductor device and said circuit substrate, wherein said underfill contacts said semiconductor device and said circuit substrate, wherein said copper pillar has a sidewall with a bottom edge not covered by said solder, but covered by said underfill.

25. The chip package of claim 24, wherein said one of said multiple metal bumps further comprises a nickel-containing layer between said solder and said copper pillar.

26. The chip package of claim 25, wherein said nickel-containing layer has a thickness between 1 and 10 micrometers.

27. The chip package of claim 24, wherein said one of said multiple metal bumps further comprises a titanium-containing layer between said copper pillar and one of said multiple first, second, third and fourth contact pads.

28. The chip package of claim 24, wherein said one of said multiple metal bumps further comprises a titanium-nitride layer between said copper pillar and one of said multiple first, second, third and fourth contact pads.

29. The chip package of claim 24, wherein said underfill has no portion vertically under said semiconductor device.

30. The chip package of claim 24 further comprising multiple contact balls on a top surface of said circuit substrate.

31. The chip package of claim 24, wherein said semiconductor device further comprises a polymer layer at a top of said semiconductor device, wherein said one of said multiple metal bumps is further on a top surface of said polymer layer.

32. The chip package of claim 24, wherein said semiconductor device further comprises a passivation layer at a top of said semiconductor device, wherein said passivation layer comprises a nitride, wherein said one of said multiple metal bumps is further on a top surface of said passivation layer.

33. The chip package of claim 32, wherein said nitride comprises silicon nitride.

34. The chip package of claim 24, wherein no solder mask is between any neighboring two of said multiple second contact pads from said top perspective view.

35. The chip package of claim 24, wherein no solder mask is between any neighboring two of said multiple third contact pads from said top perspective view.

36. The chip package of claim 24, wherein no solder mask is between any continuous four of said multiple first contact pads from said top perspective view.

* * * * *